(12) United States Patent
Chonan et al.

(10) Patent No.: US 11,577,537 B2
(45) Date of Patent: Feb. 14, 2023

(54) LIGHT TO HEAT CONVERSION LAYER AND METHOD FOR MANUFACTURING THE SAME, AND DONOR SHEET USING THE SAME

(71) Applicant: SUMITOMO METAL MINING CO., LTD., Tokyo (JP)

(72) Inventors: Takeshi Chonan, Isa (JP); Hirofumi Tsunematsu, Isa (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 505 days.

(21) Appl. No.: 16/623,833

(22) PCT Filed: Jun. 19, 2018

(86) PCT No.: PCT/JP2018/023371
§ 371 (c)(1),
(2) Date: Feb. 11, 2020

(87) PCT Pub. No.: WO2018/235842
PCT Pub. Date: Dec. 27, 2018

(65) Prior Publication Data
US 2020/0379146 A1    Dec. 3, 2020

(30) Foreign Application Priority Data

Jun. 19, 2017  (JP) .................... PCT/JP2017/022585

(51) Int. Cl.
*B41M 5/46* (2006.01)
*H01L 51/00* (2006.01)

(52) U.S. Cl.
CPC ......... *B41M 5/465* (2013.01); *B41M 2205/06* (2013.01); *B41M 2205/30* (2013.01); *H01L 51/0013* (2013.01)

(58) Field of Classification Search
CPC ............. B41M 5/465; B41M 2205/06; B41M 2205/30; H01L 51/0013
See application file for complete search history.

(56) References Cited

U.S. PATENT DOCUMENTS

| 5,308,737 | A | 5/1994 | Bills et al. |
| 6,114,088 | A | 9/2000 | Wolk et al. |

(Continued)

FOREIGN PATENT DOCUMENTS

| CN | 102189864 A | 9/2011 |
| CN | 108602356 A | 9/2018 |

(Continued)

OTHER PUBLICATIONS

Sep. 11, 2018 Search Report issued in International Patent Application No. PCT/JP2018/023371.

*Primary Examiner* — Gerard Higgins
(74) *Attorney, Agent, or Firm* — Oliff PLC

(57) ABSTRACT

A light to heat conversion layer which has visible light permeability, excellent near infrared absorption characteristics, and which can improve the transfer accuracy of an organic electroluminescent element using laser irradiation; and a donor sheet using the light to heat conversion layer. The light to heat conversion layer contains near infrared absorption particles and a binder component. The near infrared absorption particles are composite tungsten oxide microparticles wherein if the value for the XRD peak intensity of the face of a silicon powder standard sample (manufactured by NIST, 640c) is defined as 1, the value for the ratio of XRD peak top intensity is at least 0.13, and the light transmissivity is at least 45%.

7 Claims, 1 Drawing Sheet

(56) References Cited

U.S. PATENT DOCUMENTS

| | | |
|---|---|---|
| 2004/0191564 A1 | 9/2004 | Kim et al. |
| 2011/0207603 A1 | 8/2011 | Kawahara et al. |
| 2011/0248225 A1 | 10/2011 | Mamak et al. |
| 2014/0023801 A1* | 1/2014 | Park .................. B41M 5/465 |
| | | 428/32.74 |
| 2015/0179939 A1 | 6/2015 | Choi et al. |
| 2018/0339524 A1 | 11/2018 | Sawamura et al. |

FOREIGN PATENT DOCUMENTS

| | | | |
|---|---|---|---|
| JP | 2000-515083 A | 11/2000 | |
| JP | 2002-534782 A | 10/2002 | |
| JP | 2004-200170 A | 7/2004 | |
| JP | 3562830 B2 | 9/2004 | |
| JP | 2012-532822 A | 12/2012 | |
| JP | 2015-527700 A | 9/2015 | |
| JP | 2016-009634 A | 1/2016 | |
| JP | 2016-009635 A | 1/2016 | |
| JP | 2016-538700 A | 12/2016 | |
| WO | 98/03346 A1 | 1/1998 | |
| WO | WO-2005037932 A1 * | 4/2005 | ............ C01G 41/00 |
| WO | 2015/080493 A1 | 6/2015 | |
| WO | 2017/104853 A1 | 6/2017 | |
| WO | 2017/104854 A1 | 6/2017 | |

* cited by examiner

LIGHT TO HEAT CONVERSION LAYER AND METHOD FOR MANUFACTURING THE SAME, AND DONOR SHEET USING THE SAME

TECHNICAL FIELD

The present invention relates to a light to heat conversion layer (hereinafter referred to as "LTHC layer") and a method for manufacturing the same, and a donor sheet using the same.

BACKGROUND

A LTHC layer is a layer having a property that a part irradiated with an infrared light or near-infrared light generates heat whereas an unirradiated part does not generate heat. Therefore, since the LTHC layer can generate heat only at a desired site by irradiation of infrared laser or near-infrared laser, it is expected to be applied to a wide variety of fields including electronics, medicine, agriculture, machine.

Regarding an urgent use, a use as a donor sheet is conceivable, which is used for manufacturing an organic electroluminescence device in the field of electronics. Therefore, the LTHC layer will be described with the donor sheet taken as an example thereof.

As a method of forming an organic electroluminescence device on a substrate, a metal mask method, a laser transfer method, an ink-jet method and the like have been investigated. It is difficult for the metal mask method to respond to a larger planar size of the next-generation large-screen display devices, etc., and there still remains many technical problems in application of the inkjet method. Therefore, it is expected that the laser transfer method will be a mainstream for large-screen displays.

There are several laser transfer methods. Among them, a layer formation method which involves use of a film called a "donor sheet" is a mainstream. As a donor sheet, for example, a layer including a light absorbing layer called a LTHC layer and, for example, a layer of an organic compound having an electroluminescence property as a transferred layer, formed on a film base material, has been used. Although many methods are proposed for forming an organic electroluminescence device on a substrate by a laser transfer method, they have a common fundamental principle of operation. In other words, when a specified site of the LTHC layer is irradiated with a laser beam, the light is absorbed by the LTHC layer to generate heat which can transfer the organic electroluminescence device formed as a transferred layer.

A wide variety of materials are proposed as a light absorbing material for the LTHC layer as the donor sheet. For example, Patent Document 1 discloses, organic and inorganic absorbing materials such as dyes absorbing a light in the infrared region and carbon black, metals, metal oxides, or metal sulfides, and other known pigments and absorbers. Patent Document 2 discloses dyes, pigments, metals, metal compounds, metal films and the like. Patent Document 3 discloses black aluminum. Patent Document 4 discloses carbon black, graphite, and infrared dyes.

As described above, when an organic electroluminescence device is formed, for example, by the laser transfer method, a desired site in the LTHC layer is irradiated with a laser beam, thereby the organic electroluminescence device contained in the donor sheet is transferred. However, for example, when the donor sheet includes a defect such as a foreign matter or uneven application, an organic electroluminescence device at the site irradiated with a laser beam may fail to be normally transferred, resulting in generation of dots which are unlit after fabricated as a display device. Therefore, in order to enhance yield, it is considered that a donor sheet including a defect is detected by visual observation or by using a visible light sensor or the like before the transfer by a laser beam.

However, when the materials proposed in Patent Documents 1 to 4 as the light absorbing materials to be applied to the LTHC layer are used, transmission property of the LTHC layer to a visible light is not sufficient. In other words, when the light absorbing materials disclosed in Patent Documents 1 to 4 are used, the LTHC layer shows a very dark black color having substantially no light transmission property. Therefore, when such a LTHC layer was applied as the donor sheet, it was considered that defects were not able to be detected by visual observation or by using a visible light sensor or the like.

Therefore, the applicant of the present invention disclosed in Patent Document 5 a LTHC layer having a visible light transmission property containing composite tungsten oxide fine particles which are near-infrared absorbing particles and a binder component, and a donor sheet using the LTHC layer.

Patent Document 1 Japanese Translation of PCT International Application Publication No. 2000-515083
Patent Document 2 Japanese Translation of PCT International Application Publication No. 2002-534782
Patent Document 3 Japanese Patent Publication No. 3562830
Patent Document 4 Japanese Unexamined Patent Application Publication No. 2004-200170
Patent Document 5 Japanese Unexamined Patent Application Publication No. 2016-009634

BRIEF SUMMARY OF THE INVENTION

Problems to be Solved by the Invention

As described above, since the present inventors disclose the LTHC layer having a visible light transmission property and the donor sheet using the LTHC layer, the defect can be detected by visual observation or by using a visible light sensor or the like.

However, with a recent technological innovation of organic electroluminescence devices, there has been an increased demand for high transfer accuracy of the organic electroluminescence device contained in the donor sheet by irradiation of a laser beam.

According to the investigation by the applicants of the present invention, they found that a LTHC layer having the visible light transmission property containing composite tungsten oxide fine particles which are near-infrared absorbing particles and a binder component, and a donor sheet using the LTHC layer according to the related art, disclosed in Patent Document 5, it is difficult to transfer the organic electroluminescence device with high accuracy by irradiation of a laser beam.

The present invention has been attained under the above-described circumstances, and the problem to be solved is to provide a LTHC layer, having the visible light transmission property, excellent in near-infrared absorption property, enabling application in a wide variety of fields including electronics, medicine, agriculture, machine, etc., and further capable of transferring the organic electroluminescence device with high accuracy by irradiation of a laser beam; a method for manufacturing thereof; and a donor sheet using the LTHC layer.

Means for Solving the Problem

In order to solve the above-described problems, the present inventors have studied. As a result, they attained composite tungsten oxide fine particles having a value of a XRD peak top intensity ratio of 0.13 or more, when a value of a XRD peak intensity of a (220) plane of a silicon powder standard sample (640c, manufactured by NIST) is 1.

Since the composite tungsten oxide fine particles having the predetermined XRD peak intensity are excellent in near-infrared absorption property, the present inventors found a highly versatile LTHC layer with high positional accuracy of heat generation such as improving transfer accuracy of an organic electroluminescence device by irradiation of a laser beam, and a donor sheet or the like using the LTHC layer. Thus the present invention has been completed.

A first invention to solve the above-described problems is a light to heat conversion layer containing:
near-infrared absorbing particles and
a binder component;
wherein the near-infrared absorbing particles are composite tungsten oxide fine particles having a value of a XRD peak top intensity ratio of 0.13 or more, when a value of a XRD peak intensity ratio of a (220) plane of a silicon powder standard sample (640c, manufactured by NIST) is 1.

A second invention is the light to heat conversion layer according to the first invention,
wherein the composite tungsten oxide fine particles are composite tungsten oxide fine particles represented by chemical formula: $M_yWO_z$ (where M is one or more kinds of elements selected from: H, He, an alkali metal, an alkaline earth metal, a rare earth element, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, I, and Yb; satisfying $0.1 \leq y \leq 0.5$, $2.2 \leq z \leq 3.0$).

A third invention is the light to heat conversion layer according to the first or second invention, wherein the composite tungsten oxide fine particles have a hexagonal crystal structure.

A fourth invention is the light to heat conversion layer according to any one of first to third inventions, wherein a crystallite size of the composite tungsten oxide fine particles is 200 nm or less.

A fifth invention is the light to heat conversion layer according to any one of the first to fourth inventions, wherein a thickness of the light to heat conversion layer is 5 μm or less.

A sixth invention is the light to heat conversion layer according to any one of the first to fifth inventions, which is a dried and cured ink containing the near-infrared absorbing particles, a dispersant, a solvent, and a binder component, coated on a base material.

A seventh invention is a donor sheet having the light to heat conversion layer according to any one of the first to sixth inventions, a film base material, and a transferred layer.

A eighth invention is
a method for manufacturing a light to heat conversion layer containing near-infrared absorbing particles and a binder component,
wherein the infrared absorbing material ultrafine particles are composite tungsten oxide fine particles, the composite tungsten oxide particles are produced by firing so that a value of its XRD peak top intensity ratio is 0.13 or more, when a value of a XRD peak intensity of a (220) plane of a silicon powder standard sample (640c, manufactured by NIST) is 1, and the obtained composite tungsten oxide particles are added into the binder component while maintaining the value of the XRD peak top intensity ratio at 0.13 or more.

Advantage of the Invention

With the LTHC layer of the present invention which has low haze and visible light transparency, a near-infrared light can be absorbed and heat can be generated. In other words, only the site irradiated with a light in the LTHC layer of the present invention is to be a heat generating site with high accuracy, and thus generates heat. Accordingly, heat resulting from LTHC of the LTHC layer of the present invention is to be a heat source.

DETAILED DESCRIPTION OF THE INVENTION

In order to solve the above-described problems, the present inventors have studied. As a result, the present inventors found that, in a LTHC layer having the visible light transmission property containing composite tungsten oxide fine particles which are near-infrared absorbing particles and a binder component, according to the related art, disclosed in Patent Document 5, there is a haze resulting from the composite tungsten oxide fine particles dispersed in the binder component. The present inventors found that the irradiated laser beam is scattered due to the haze, and, as a result, enhancement of the transfer accuracy of the organic electroluminescence device is inhibited.

Here, the present inventors have studied on a method for reducing haze. As a result, they found composite tungsten oxide fine particles which have a value of a XRD peak top intensity ratio of 0.13 or more, when a value of a XRD peak intensity ratio of a (220) plane of a silicon powder standard sample (640c, manufactured by NIST) is 1.

The present inventors found that the composite tungsten oxide fine particles having the predetermined XRD peak intensity is excellent in near-infrared absorption property and exhibits a sufficient near-infrared absorption property in a usage less than that of the composite tungsten oxide fine particles according to the related art. In addition, the present inventors also found that a highly versatile LTHC layer having the visible light transmission property with high positional accuracy of heat generation such as improving transfer accuracy of an organic electroluminescence device by irradiation of a laser beam, and a donor sheet can be realized while reducing the haze and maintaining the visible light transmission property since the usage of the composite tungsten oxide fine particles in the LTHC layer having the visible light transmission property is reduced.

Hereinafter, embodiments for carrying out the present invention will be explained with reference to drawings. However, the present invention is not limited to the following embodiments, and various modifications and substitutions can be made to the following embodiment without departing from the scope of the present invention.

Figure 2:
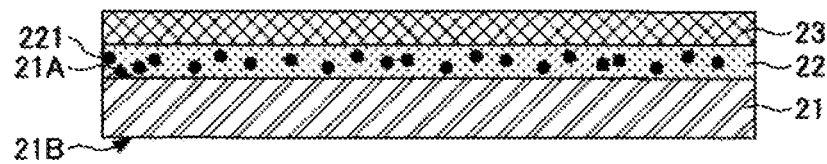
FIG. 2 is an explanatory diagram of an exemplary cross-sectional configuration of a donor sheet.

The donor sheet according to the present invention will be explained with reference to FIG. 2 illustrating an example of a cross sectional configuration of the donor sheet.

As illustrated in FIG. 2, a donor sheet 20 has a structure in which a LTHC layer 22 containing near-infrared absorbing particles 221 and a transferred layer 23 are laminated, for example, on one surface 21A of a film base material 21. Therefore, the configuration of the donor sheet according to the present invention will be explained in the following order: [1] LTHC layer, [2] Film base material, [3] Transferred layer, and [4] Donor sheet.

[1] LTHC Layer

The LTHC layer according to the present invention contains near-infrared absorbing particles and a binder component, the near-infrared absorbing particles being dispersed in the binder component. Hereinafter, (1) Near-infrared absorbing particles, (2) Binder component, and (3) Configuration of LTHC layer will be explained in this order.

(1) Near-Infrared Absorbing Particles

A material which absorbs a laser beam irradiated to the LTHC layer and generates heat may be selected for the near-infrared absorbing particles according to the present invention. However, since the LTHC layer of this embodiment has the visible light transmission property, it is preferred that the material for the near-infrared absorbing particles has high transmission property to the light in the visible region as well.

Specifically, the near-infrared absorbing particles are composite tungsten oxide fine particles, and are particularly preferably of a material which can absorb laser beam in the near-infrared region to generate heat and has high transmissivity to the light in the visible region. Hereinafter, the composite tungsten oxide fine particles according to the present invention will be explained in an order of: 1) Composition, 2) Crystal structure, 3) Value of XRD peak top intensity ratio, 4) Volume ratio of amorphous phase crystallite size, and 5) Dispersed particle size of near-infrared absorbing particles in LTHC layer.

It should be noted that, in the LTHC layer according to the present invention, the composite tungsten oxide fine particles are preferably used as the near-infrared absorbing particles, and a plurality of different types of near-infrared absorbing particles may be contained.

1) Composition

The composite tungsten oxide fine particles are preferably, for example, one or more kinds selected from composite tungsten oxide fine particles having chemical formula represented by $M_yWO_z$ (where M is one or more kinds of elements selected from: H, He, alkali metal, alkaline earth metal, rare earth element, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, I, and Yb; satisfying $0.1 \leq y \leq 0.5$, $2.2 \leq z \leq 3.0$).

Next, composite tungsten oxide fine particles represented by chemical formula $M_yWO_z$ will be explained.

As the near-infrared absorbing particles, composite tungsten oxide ($M_yWO_z$) which is formed by further adding element M to tungsten oxide can also be used. When the element M is added to the tungsten oxide to form the composite tungsten oxide, a free electron is generated in the composite tungsten oxide and a strong absorption property derived from the free electron appears in the near-infrared absorbing region. Therefore, it favorably becomes effective as near-infrared absorbing particles which absorb near-infrared radiation having a wavelength around 1000 nm.

In the chemical formula $M_yWO_z$ representing the composite tungsten oxide fine particles, W indicates tungsten, and O indicates oxygen. In the above formula, M is preferably one or more kinds of elements selected from H, He, alkali metal, alkaline earth metal, rare earth element, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, I, and Yb, for example.

In particular, from the viewpoint of stability in the composite tungsten oxide fine particles formed by adding element M, the element M is more preferably one or more kinds of elements selected from alkali metal, alkaline earth metal, rare earth element, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Hf, Os, Bi, I, and Yb.

From the viewpoint of enhancing optical property and resistance to weather of the composite tungsten oxide fine particles, elements belonging to alkali metals, alkaline earth metal elements, transition metal elements (rare earth element, Zr, Cr, Mn, Fe, Ru, Co, Rh, Ir, Ni, Pd, Pt, Cu, Ag, Au, Zn, Cd, Ti, Nb, V, Mo, Ta, Re, Hf, Os) are still more preferred among the elements which are more preferred as the above-described element M.

As for the composite tungsten oxide fine particles, when control of the amount of oxygen in the tungsten oxide and addition of element M which generates a free electron are performed in combination, a more efficient near-infrared absorbing particles can be obtained. When control of the amount of oxygen and addition of element M which generates a free electron are performed in combination, it is preferable to satisfy the following relation: $0.1 \leq y \leq 0.5$, $2.2 \leq z \leq 3.0$ in the chemical formula $M_yWO_z$ which represents the composite tungsten oxide.

Now, the value of y which indicates an addition amount of the element N in the above-described chemical formula of the composite tungsten oxide will be explained. When y is 0.1 or more, a sufficient amount of the free electron is generated and a target near-infrared absorption effect can be obtained, which is preferable. In addition, the more the element M is added, the more the free electron is supplied and the higher the near-infrared absorption effect becomes. However, when y is about 0.5, the effect will be saturated. In addition, when y is 0.5 or less, an impurity phase is prevented from generating in the near-infrared absorbing particles, which is preferable.

Next, the value of z which indicates control of the amount of oxygen will be explained. Regarding the value of z, the same mechanism as that of the near-infrared absorbing material represented by $W_yO_z$ also works in the near-infrared absorbing particles represented by $M_yWO_z$. In the case of $z=3.0$ as well, a free electron can be supplied due to addition of the element M as described above. Accordingly, $2.2 \leq z \leq 3.0$ is preferred.

2) Crystal Structure

The crystal structure of the composite tungsten oxide contained in the composite tungsten oxide fine particles is not particularly limited, and the composite tungsten oxide having an arbitrary crystal structure can be contained. However, when the composite tungsten oxide contained in the composite tungsten oxide fine particles has a hexagonal crystal structure, visible light transmissivity and near-infrared absorption of the particles are especially improved, which is preferable.

Figure 1:
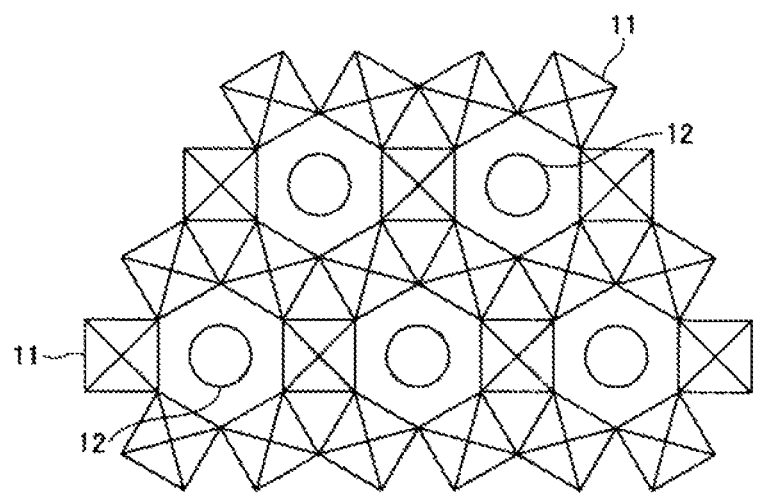
FIG. 1 is a schematic diagram of a crystal structure of a composite tungsten oxide having hexagonal crystal.

A schematic plan diagram of the hexagonal crystal structure is illustrated in FIG. 1. In FIG. 1, six octahedrons, each formed of a $WO_6$ unit indicated by numeral 11, assemble together to constitute a hexagonal void (tunnel). In the void is placed an element M indicated by numeral 12 to constitute a single unit. A plurality of the units assembles together to constitute a hexagonal crystal structure.

As described above, in the case where the composite tungsten oxide fine particles contain the composite tungsten oxide which is constituted by six octahedrons, each formed of a $WO_6$ unit, assembling together to constitute a hexagonal void with an element M placed therein, transmissivity of the light in the visible region and absorption of the light in the near-infrared region are especially enhanced. The entire composite tungsten oxide fine particles are not necessarily constituted by crystalline composite tungsten oxide fine particles having a structure illustrated in FIG. 1. For example, even when they locally have such a structure, improvement of transmissivity of the light in the visible region and absorption of the light in the near-infrared region can be obtained. Accordingly, the entire composite tungsten oxide fine particles may be crystalline or non-crystalline.

When an element M with large ion radius is added as the element M of the composite tungsten oxide, the above-described hexagonal crystal is easily formed. Specifically, the hexagonal crystal is easily formed by adding, for example, one or more selected from Cs, Rb, K, Tl, In, Ba, Li, Ca, Sr, Fe, and Sn as the element M. In order to form the hexagonal crystal, it is not limited to the case where the above-described element is added as the element M. Another element may be allowed so long as there is the element M in the hexagonal void formed of $WO_6$ unit.

When the crystal structure of the composite tungsten oxide contained in the composite tungsten oxide fine particles is uniformly hexagonal, an addition amount of the element M indicated by y is preferably 0.20 or more and 0.50 or less, and more preferably 0.25 or more and 0.40 or less. Regarding y, as described above, $2.2 \leq z \leq 3.0$ is preferred. When z=3.0, by setting the value of y to 0.33, element M is supposed to be included in every hexagonal void.

In addition, the composite tungsten oxide contained in the composite tungsten oxide fine particles may take a tetragonal or cubic tungsten bronze structure in addition to the above-described hexagonal crystal, and the composite tungsten oxide having such a structure may also be effective as a near-infrared absorbing material. In the composite tungsten oxide, an absorption site in the near-infrared region tends to shift depending on its crystal structure. For example, the absorption site in the near-infrared region in the case of the cubic structure tends to shift toward a longer-wavelength side compared to the case of the tetragonal structure, and the absorption site in the case of the hexagonal crystal tends to shift toward still longer-wavelength side compared to the case of the tetragonal structure. In accordance with the shift of the absorption site, the hexagonal crystal shows the least absorption of the light in the visible region, the tetragonal crystal shows the second least absorption, and the cubic crystal shows the largest absorption of the light in the visible region among them. Accordingly, in the application where high transmissivity of the light in the visible region and high absorptivity of the light in the near-infrared region are required, hexagonal crystalline tungsten bronze is preferably used. However, the tendency of the optical property described herein is merely a rough tendency and varies depending on the kind or addition amount of the element M, or the amount of oxygen as well, and a material is not limited thereto, for the infrared absorbing particles used for the LTHC layer of this embodiment.

The crystal structure of the composite tungsten oxide contained in the composite tungsten oxide fine particles which can be used for the LTHC layer of this embodiment is not limited as described above, and, for example, composite tungsten oxide having a different crystal structure may also be contained together.

As described above, however, since the hexagonal crystalline composite tungsten oxide fine particles can enhance visible light transmissivity and near-infrared absorption, they can be especially preferably used as near-infrared absorbing particles used for the LTHC layer of this embodiment. Furthermore, when cesium or the like is used as the element M, the crystal structure of the composite tungsten oxide is likely to be hexagonal crystal. Accordingly, hexagonal crystalline cesium tungsten oxide fine particles or hexagonal crystalline rubidium tungsten oxide fine particles may be more preferably used as the composite tungsten oxide fine particles.

3) Value of XRD Peak Top Intensity Ratio

According to the investigation by the present inventors, the composite tungsten oxide fine particles having a value of a XRD peak top intensity ratio of 0.13 or more have an extremely high molar absorbance coefficient for a light having a wavelength around 1000 nm. Furthermore, since transmissivity of the light in the visible region is high whereas transmissivity of the light in the infrared region, especially in the near-infrared region is low, contrast of the transmissivity between the light in the visible region and the near-infrared region is great. Therefore, even when the composite tungsten oxide fine particles are added to the LTHC layer in such an amount to enable sufficient absorption of the light in the near-infrared region, transmissivity of the light, especially in the visible region, can be maintained at a high level, and hence the composite tungsten oxide fine particles can be particularly preferably used as the near-infrared absorbing particles.

Furthermore, from the viewpoint of the near-infrared absorption property, the value of the XRD peak top intensity ratio of the composite tungsten oxide fine particles is 0.13 or more, when the XRD peak intensity of the (220) plane of the silicon powder standard sample (640c, manufactured by NIST) is 1.

Herein, as the standard sample, a silicon powder standard sample (640c, manufactured by NIST) which is universal in the art is used, and a (220) plane in the silicon powder standard sample whose XRD peak does not overlap the XRD peak of the composite tungsten oxide fine particles is taken as a reference.

Furthermore, other conditions for a measurement is always constant in order to ensure objective quantitatively.

Specifically, a sample holder having a depth of 1.0 mm is filled with a fine particle sample according to the known procedure for a X-ray diffraction measurement. Specifically, it is preferred that the sample holder is filled randomly and gradually, and evenly and densely as much as possible, in order to avoid generation of preferential orientation (orientation of crystal) in the fine particle sample.

A measurement is performed according to a θ-2θ X-ray powder diffraction method in a step scan mode (step size: 0.0165° (2θ) counting time: 0.022 msec/step) using a X-ray tube as a X-ray source at an output setting of 45 kV/40 mA, wherein Cu is used as an anode target material of the X-ray tube.

In this case, since the XRD peak intensity varies depending on a use time of the X-ray tube, it is desirable that the use time of the X-ray tube be almost the same between the samples. In order to ensure objective quantitatively, it is required that a maximum difference in the X-ray tube use time between the samples be set to 1/20 or less of a predicted service life of the X-ray tube. Examples of the more desirable measurement method include a method for calculating the XRD peak top intensity ratio by performing a measurement of the silicon powder standard sample in every measurement of the X ray diffraction pattern of the composite tungsten oxide fine particles. In the present invention, this measurement method was used. Most often, the predicted service life of the X-ray tube of the commercially available X-ray apparatus is thousands hours or more and the measurement time per sample is several hours or less. Therefore, when the above-described desirable measurement method is performed, the effect of the X-ray tube use time on the XRD peak top intensity ratio can be suppressed to a negligibly low level.

In addition, in order to keep the temperature of the X-ray tube constant, it is desirable that the temperature of the cooling water for the X-ray tube be also kept constant.

The XRD peak top intensity is a peak intensity at 2θ corresponding to a highest peak count in the X ray diffraction pattern. In the hexagonal crystalline Cs composite tungsten oxide or Rh composite tungsten oxide, 2θ corresponding to a peak count falls in the rage from 25° to 31° in the X ray diffraction pattern.

The above-described XRD peak top intensity of the composite tungsten oxide fine particles is closely related to the crystallinity of the fine particles, and further related to the free electron density in the fine particles. The present inventors found that the XRD peak top intensity has a profound effect on the near-infrared shielding property of the composite tungsten oxide fine particles, Specifically, the present inventors found that when the value of the XRD peak top intensity ratio is 0.13 or more, the free electron density in the fine particles is insured and the desired near-infrared shielding property can be obtained. The value of the XRD peak top intensity ratio of 0.13 or more is good enough, and preferably 0.7 or less.

4) Volume Ratio/Crystallite Size of Amorphous Phase

Furthermore, the composite tungsten oxide fine particles preferably include single crystal with a volume ratio of the amorphous phase being 50% or less.

When the composite tungsten oxide fine particles include single crystal with a volume ratio of the amorphous phase being 50% or less, the crystallite size can be 200 nm or less while maintaining the XRD peak top intensity. When the crystallite size of the composite tungsten oxide fine particles is 200 nm or less, the dispersed particle size can fall within a preferable range of 10 nm or more and 200 nm or less, from the viewpoint of the near-infrared absorption property of the composite tungsten oxide fine particles.

On the other hand, in the case where the composite tungsten oxide fine particles have the dispersed particle size of 1 nm or more and 200 nm or less although an amorphous phase exists at the volume ratio of more than 50% or in the case where the composite tungsten oxide fine particles are polycrystalline, the value of the XRD peak top intensity ratio of the composite tungsten oxide fine particles is less than 0.13, which may result in insufficient near-infrared absorption property and insufficiently exhibited near-infrared shielding property.

The composite tungsten oxide fine particles according to the present invention can be manufactured by a plasma synthesis method or a solid phase reaction method as described in Example mentioned below. The manufacturing conditions for the plasma synthesis method and the solid phase reaction method are set so that the value of the XRD peak top intensity ratio of the composite tungsten oxide fine particles is more than 0.13.

In this case, from the viewpoint of the near-infrared absorption property, the crystallite size of the composite tungsten oxide fine particles is preferably 10 nm or more. In addition, the crystallite size of the composite tungsten oxide fine particles is more preferably 200 nm or less and 10 nm or more. It is because when the crystallite size falls within a range of 200 nm or less and 10 nm or more, the value of the XRD peak top intensity ratio is more than 0.13 and more excellent infrared shielding property is exhibited.

The X ray diffraction pattern of the composite tungsten oxide fine particles in the composite tungsten oxide fine particle dispersion liquid after cracking, pulverization, or dispersion described below is also maintained in the X ray diffraction pattern of the composite tungsten oxide fine particles obtained after removal of a volatile component from the composite tungsten oxide fine particle dispersion liquid according to the present invention or in the X ray diffraction pattern of the composite tungsten oxide fine particles contained in the dispersion body obtained from the dispersion liquid.

As a result, the effect of the present invention can be exhibited so long as the crystal states such as the XRD pattern, XRD peak top intensity, or crystallite size of the composite tungsten oxide fine particles in the composite tungsten oxide fine particle dispersion liquid or in the composite tungsten oxide fine particle dispersion body obtained from the dispersion liquid are the same as the crystal states of the composite tungsten oxide fine particles which can be used in the present invention.

The composite tungsten oxide fine particles can be confirmed as single crystal by the fact that no crystal grain boundary but only uniform cross stripes can be observed in each of the fine particles in an electron microscopic image such as a transmission-type electron microscopic image. In addition, in the composite tungsten oxide fine particles, the volume ratio of the amorphous phase being 50% or less in the composite tungsten oxide fine particles is confirmed by the fact that almost no unclear cross stripes are observed but uniform cross stripes can be observed over an entire body of the particles, again in the transmission-type electron microscopic image. Since the amorphous phase often exists on the periphery of the particles, the volume ratio of the amorphous phase can be often calculated by focusing on the periphery of the particles. For example, in the case where the amorphous phase exhibiting unclear cross stripes is present as being layered on the periphery of the perfectly-spherical composite tungsten oxide fine particles, when the thickness is 20% or less of the particle size, the volume ratio of the amorphous phase in the composite tungsten oxide fine particles is 50% or less.

On the other hand, in the case where the composite tungsten oxide fine particles are dispersed in a coating layer constituting the composite tungsten oxide fine particle dispersion body, in a layer obtained by performing a predetermined operation to the coating layer to cure a resin in the coating layer (referred to as a "cured layer" in some cases in the present invention), and in the resin or the like, when the difference calculated by subtracting a crystallite size from an average particle size of the dispersed composite tungsten oxide fine particles is 20% or less, the composite tungsten oxide fine particles can be said to be single crystal in which the volume ratio of the amorphous phase is 50% or less.

The average particle size of the composite tungsten oxide fine particles can be obtained by measuring particle sizes of 100 composite tungsten oxide fine particles from the transmission-type electron microscopic image of the cured layer (LTHC layer) using an image processing apparatus and calculating an average value thereof. After that, steps of synthesizing, pulverizing, and dispersing the composite tungsten oxide fine particles may be appropriately adjusted depending on the manufacturing equipment so that a difference between the average particle size of the composite tungsten oxide fine particles dispersed in the composite tungsten oxide fine particle dispersion body and the crystallite size is 20% or less.

5) Dispersed Particle Size of Near-Infrared Absorbing Particles in LTHC Layer The dispersed particle size of the near-infrared absorbing particles in the LTHC layer is not particularly limited and can be selected depending on the degree of transparency, the degree of absorption of the laser beam, or the like required for the LTHC layer. For example, the near-infrared absorbing particles are preferably fine particles, and specifically, the dispersed particle size of the near-infrared absorbing particle is particularly preferably 1 nm or more and 200 nm or less.

When the dispersed particle size of the near-infrared absorbing particle is 1 nm or more and 200 nm or less, the light scattering due to geometric scattering or Mie scattering does not occur, which results in reduced haze. When this result is taken into consideration in transferring the organic electroluminescence device or the like by irradiation of a laser beam, for example, the LTHC layer according to the present invention, which does not scatter the light, is preferred from the view point of improving accuracy of the position to be processed and of facilitating increase of the visible light transmissivity. Furthermore, since the scattered light decreases in proportion to the sixth power of the particle size in the Rayleigh scattering region, scattering is reduced and transparency is improved as the dispersed particle size decreases. In this regard, when the dispersed particle size is 200 nm or less, there is less scattered light, which is favorable from the viewpoint of facilitating enhancement of transparency.

As described above, since the LTHC layer can generate heat only at a desired site with high positional accuracy, it is considered to be applied to a wide variety of fields including electronics, medicine, agriculture, machine.

For example, in the field of organoelectroluminescence in electronics, a thermoset resin can be cured and heat transferred. Specifically, when the LT IC layer of the present invention is applied to the donor sheet to be used for manufacturing the organic electroluminescence device by irradiation of a laser beam, for example, a donor sheet having visible light transmission property can be manufactured which can improve transfer accuracy due to low haze.

From the above-described viewpoints, the haze of the LTHC layer is preferably 3% or less.

The term dispersed particle size means a particle size at an integrated value of 50% in particle size distribution obtained by a laser diffraction/scattering method, and the term dispersed particle size has the same meaning elsewhere in the present specification as well.

The reason is as follows: since the dispersed particle size of the near-infrared absorbing particles is 1 nm or more, the particles can sufficiently absorb the laser beam, when applied to the donor sheet, for example. In addition, the dispersed particle size of the near-infrared absorbing particles of 200 nm or less enables stable dispersion, for example, when the near-infrared absorbing particles are mixed with a dispersant, a solvent, or the like, thereby attaining especially uniform coating on the base material. Further, the transparency of the LTHC layer can be enhanced while maintaining transmission property to the light, particularly in the visible region, without the light being fully absorbed due to scattering.

(2) Binder Component

A binder component is not particularly limited and an arbitrary binder component may be used. However, since an object of the present invention is to provide a LTHC layer having visible light transmission property, it is preferred to use a binder component which is excellent in visible light transmission property when it is a solid state. In addition, when a laser beam is irradiated to the LTHC layer, it is preferred to use a binder component excellent in transmission property to the light in the infrared region, especially in the near-infrared region so that the laser beam can be irradiated to the near-infrared absorbing particles contained in the LTHC layer.

Specifically, as a binder component, for example, a UV curable resin (an ultraviolet curable resin), a thermoset resin, an electron beam curable resin, a normal temperature curable resin, a thermoplastic resin or the like may be selected depending on the object. Specifically, examples include, polyethylene resin, polyvinyl chloride resin, polyvinylidene chloride resin, polyvinyl alcohol resin, polystyrene resin, polypropylene resin, ethylene vinyl acetate copolymer, polyester resin, polyethylene terephthalate resin, fluororesin, a polycarbonate resin, acrylic resin, and polyvinyl butyral resin. These resins may be used alone or as a mixture. In addition, as a binder component, a metal alkoxide may be utilized. Examples of the metal alkoxide includes alkoxides of Si, Ti, Al, Zr and the like. Binders using such metal alkoxides can form an oxide layer by hydrolysis and condensation polymerization by heating or the like.

(3) LTHC Layer and its Configuration

As described above, the LTHC layer according to the present invention can be allowed to generate heat only at the desired position with high positional accuracy. As the result, it is expected to find application in a wide variety of fields including electronics, medicine, agriculture, machine and the like.

The configuration of the LTHC layer according to the present invention will be hereinafter explained in the following order: 1) Ratio of near-infrared absorbing particles to binder component; 2) Solar transmissivity of LTHC layer; 3) Thickness of LTHC layer; and 4) Method for manufacturing LTHC layer.

1) Ratio of Near-Infrared Absorbing Particles to Binder Component

The rate of the near-infrared absorbing particles contained in the LTHC layer to the binder component is not particularly limited and may be arbitrarily selected depending on the thickness of the LTHC layer, the laser absorption property required for the LTHC layer and the like. However, when the LTHC layer is used for various applications, for example, the ratio of the near-infrared absorbing particles to the binder component is preferably selected so that the LTHC layer can maintain the shape of the layer.

An optional component other than the above-described near-infrared absorbing particles and binder component may also be added to the LTHC layer. In addition, as described later, when the LTHC layer is formed, for example, a dispersant or a solvent may be added to an ink which is a raw material of the LTHC layer, and these component may remain and be contained in the LTHC layer.

2) Solar Transmissivity of LTHC Layer

The LTHC layer according to the present invention preferably has a solar transmissivity of 45% or less. This is because sufficient heat is generated in the LTHC layer when the LTHC layer has the solar transmissivity of 45% or less.

When the donor sheet is transferred as the layer to be transferred, a laser beam having a wavelength in the near-infrared region, especially a wavelength near 1000 nm is mainly used. Accordingly, it is preferable that the LTHC layer has high absorptivity of the light in the region. In other words, it preferably has a low transmissivity to the light in the region. In addition, with the solar transmissivity of 45% or less, the LTHC layer sufficiently absorbs the light having a wavelength near 1000 nm and generates heat, which is preferable. For sufficient absorption of the light having a wavelength near 1000 nm, transmissivity of the LTHC layer to the light having a wavelength around 1000 nm is preferably 20% or less, and more preferably 15% or less.

The thickness of the LTHC layer is not particularly limited and arbitrarily selected depending on an infrared absorption property of the near-infrared absorbing particles added to the LTHC layer, packing density of the near-infrared absorbing particles in the LTHC layer, required visible light transmissivity, solar transmissivity and the like.

3) Thickness of the LTHC Layer

The thickness of the LTHC layer according to the present invention is preferably 5 µm or less, and more preferably 3 µm or less. The reason is as follows. When the LTHC layer becomes thicker, the heat generated by irradiation of the LTHC layer with a laser beam will be more easily diffused. For example, when the LTHC layer is used as the LTHC layer for the donor sheet, the heat may be diffused in in-plane direction from the part at which the laser beam is irradiated. As a result, the non-irradiated portion of the transferred layer may also be possibly peeled and transferred, which is unpreferable.

The lower limit of the thickness of the LTHC layer is not particularly limited and may be arbitrarily selected depending on a near-infrared absorption property or the like of the near-infrared absorbing particles. In this regard, the thickness of the LTHC layer is preferably 500 nm or more, and still more preferably 1 µm or more. The reason is as follows. With thickness of the LTHC layer of 500 nm or more, the amount of heat generated by irradiation of the laser beam can be maintained, thereby easily maintaining the shape of the LTHC layer without excessively increasing the density of the near-infrared absorbing particles dispersed in the LTHC layer.

4) Method of Manufacturing LTHC Layer

An exemplary configuration of a method of manufacturing the LTHC layer according to the present invention will be explained.

For example, an ink containing near-infrared absorbing particles, a dispersant, a solvent, and a binder component is manufactured, and the resulting ink is coated onto a base material, the coated ink is dried, and the dried ink is cured to form the above-described LTHC layer.

Examples of the base material onto which the ink containing the near-infrared absorbing particles, dispersant, solvent, and binder component is coated include, for example, a film base material. Although the base material may be constituted by a film base material alone, a film base material with an arbitrary layer formed thereon may be used.

Therefore, application of the ink containing the near-infrared absorbing particles, dispersant, solvent, and binder component is not limited to the case where the above-described ink is directly coated onto the film base material. For example, the case where an intermediate layer described later or the like is formed on a film base material and the ink is coated on the intermediate layer formed on the film base material is also encompassed. As described above, in the case where an arbitrary layer is placed on the film base material, the ink is applied, thereafter it may be dried and cured to form a LTHC layer.

A method of manufacturing the LTHC layer according to the present invention will be hereinafter explained in the following order: (I) Ink manufacturing step; (II) Ink application step; (III) Ink drying step; (IV) Ink curing step; and (V) Manufactured LTHC layer.

(I) Ink Manufacturing Step

The ink according to the present invention contains the near-infrared absorbing particles, a dispersant, a solvent, the above-described binder component, and the like.

The manufacturing step of the ink according to the present invention will be hereinafter explained in the following order: (i) Dispersant, (ii) Solvent, (iii) Addition amounts of dispersant and solvent in ink, (iv) Pulverizing/dispersing step, and (v) Mixing step.

(i) Dispersant

A dispersant is an additive to stably disperse the near-infrared absorbing particles in a solvent when compounded in an ink, and various kinds of known dispersants may be used.

In this regard, it preferably has an amine-containing group, a hydroxyl group, a carboxyl group, or an epoxy group as a functional group. These functional groups have effect of adsorbing onto the composite tungsten oxide fine particles to prevent agglomeration and of homogenously dispersing the composite tungsten oxide fine particles according to the present invention in the ink or in the LTHC layer. The polymeric dispersant having any one of these functional groups in its molecule is more preferred.

For example, polymeric dispersants such as acrylic polymeric dispersant, silane-based coupling agents, titanate-based coupling agents, aluminum-based coupling agents and the like may be preferably used.

Preferred specific examples of the commercially available dispersant include:
SOLSPERSE 3000, SOLSPERSE 9000, SOLSPERSE 11200, SOLSPERSE 13000, SOLSPERSE 13240, SOLSPERSE 13650, SOLSPERSE 13940 SOLSPERSE 16000, SOLSPERSE 17000, SOLSPERSE 18000, SOLSPERSE 20000, SOLSPERSE 21000, SOLSPERSE 24000 SC, SOLSPERSE 24000 GR, SOLSPERSE 26000, SOLSPERSE 27000, SOLSPERSE 28000, SOLSPERSE 31845, SOLSPERSE 32000, SOLSPERSE 32500, SOLSPERSE 32550, SOLSPERSE 32600, SOLSPERSE 33000, SOLSPERSE 33500, SOLSPERSE 34750, SOLSPERSE 35100 SOLSPERSE 35200, SOLSPERSE 36600, SOLSPERSE 37500, SOLSPERSE 38500, SOLSPERSE 39000, SOLSPERSE 41000, SOLSPERSE 41090, SOLSPERSE 53095, SOLSPERSE 55000, SOLSPERSE 56000, SOLSPERSE 76500 and the like manufactured by Lubrizol Japan Limited;
Disperbyk-101, Disperbyk-103, Disperbyk-107, Disperbyk-108, Disperbyk-109, Disperbyk-110, Disperbyk-111 Disperbyk-112, Disperbyk-116, Disperbyk-130, Disperbyk-140, Disperbyk-142, Disperbyk-145, Disperbyk-154, Disperbyk-161, Disperbyk-162, Disperbyk-163, Disperbyk-164, Disperbyk-165, Disperbyk-166, Disperbyk-167, Disperbyk-168, Disperbyk-170, Disperbyk-171, Disperbyk-174, Disperbyk-180, Disperbyk-181 Disperbyk-182, Disperbyk-183, Disperbyk-184, Disperbyk-185, Disperbyk-190 Disperbyk-2000, Disperbyk-2001, Disperbyk-2020, Disperbyk-2025, Disperbyk-2050 Disperbyk-2070, Disperbyk-2095, Disperbyk-2150, Disperbyk-2155, Anti-Terra-U, Anti-Terra-203, Anti-Terra-204, BYK-P104, BYK-P104S, BYK-220S, BYK-6919 and the like manufactured by BYK Japan KK;
EFKA4008, EFKA4046, EFKA4047, EFKA4015, EFKA4020, EFKA4050, EFKA4055, EFKA4060 EFKA4080, EFKA4300, EFKA4330, EFKA4400, EFKA4401, EFKA4402, EFKA4403, EFKA4500 EFKA4510, EFKA4530, EFKA4550, EFKA4560, EFKA4585, EFKA4800, EFKA5220, EFKA6230, JONCRYL67, JONCRYL678, JONCRYL586, JONCRYL611, JONCRYL680, JONCRYL682, JONCRYL690, JONCRYL819, JONCRYL-JDX5050 and the like manufactured by BASF Japan Ltd.;
AJISPER PB-711, AJISPER PB-821, AJISPER PB-822 and the like manufactured by Ajinomoto Fine-Techno Co., Inc.

(ii) Solvent

A solvent is one for dispersing near-infrared absorbing particles when an ink is manufactured, and various kinds of solvents may be selected including alcohol-based solvents, ketone-based solvents, hydrocarbon-based solvents, glycol-based solvents, aqueous solvents. Specific examples include alcohol-based solvents such as methanol, ethanol, 1-propanol, isopropanol, butanol, pentanol, benzyl alcohol, diacetone alcohol; ketone-based solvents such as acetone, methyl ethyl ketone, methyl propyl ketone, methyl isobutyl ketone, cyclohexanone, isophorone; ester-based solvents such as 3-methyl-methoxy-propionate; glycol derivatives such as ethylene glycol monomethyl ether, ethylene glycol monoethyl ether, ethylene glycol isopropyl ether, propylene glycol monomethyl ether, propylene glycol monoethyl ether, propylene glycol methyl ether acetate, propylene glycol ethyl ether acetate; amides such as formamide, N-methyl-formamide, dimethyl formamide, dimethyl acetamide, N-methyl-2-pyrrolidone; aromatic hydrocarbons such as toluene, xylene; halogenated hydrocarbons such as ethylene chloride, chlorobenzene and the like. Among them, organic solvents of low polarity are preferred, and, in particular, isopropyl alcohol, ethanol, 1-methoxy-2-propanol, dimethyl ketone, methyl ethyl ketone, methyl isobutyl ketone, toluene, propylene glycol monomethyl ether acetate, n-butyl acetate and the like are more preferred. These solvents may be used singly or in combination of two or more kinds thereof.

(iii) Addition Amount of Dispersant and Solvent in Ink

Addition amounts of the dispersant and the solvent are also not particularly limited.

The addition amount of the dispersant may be arbitrarily selected depending on the addition amount of the near-infrared absorbing particles, dispersion liquid performance of the dispersant and the like.

Moreover, the addition amount of the solvent may be arbitrarily selected considering workability during application of the ink on the base material, time required for the drying step after application and the like.

Furthermore, in addition to the near-infrared absorbing particles, dispersant, solvent, binder described above, arbitrary additive component may be added to the ink if necessary. For example, in order to enhance dispersibility of the near-infrared absorbing particles, a coating adjuvant such as a surfactant may be added.

A method of preparing an ink is not particularly limited. The ink can be prepared by weighing and mixing raw materials of the ink so as to attain a desired ratio.

(iv) Pulverizing/Dispersing Step

The near-infrared absorbing particles, the dispersant, and the solvent may be pulverized/dispersed in advance to prepare a dispersion liquid, and a binder component is added to the resulting dispersion liquid to obtain an ink. A method of pulverizing/dispersing the near-infrared absorbing particles, the dispersant, and the solvent is not particularly limited, and may be performed using a paint shaker, ultrasonic irradiation, a bead mill, or a sand mill, for example.

A diameter of the dispersed particles of the near-infrared absorbing particles in the dispersion liquid is preferably 1 nm or more and 200 nm or less.

In pulverizing/dispersing the near-infrared absorbing particles, the step conditions of pulverizing/dispersing are set so that the value of the XRD peak top intensity ratio of the near-infrared absorbing particles is kept at 0.13 or more, when the XRD peak intensity of the (220) plane of the silicon powder standard sample (640c, manufactured by NIST) is 1. With such a setting, excellent optical properties are exhibited in the dispersion liquid, the ink, and the donor sheet.

(v) Mixing Step

When the dispersion liquid and the binder component are mixed to form an ink, it is sufficient to perform mixing so as to allow both be fully mixed. It is because the dispersed particle size of the near-infrared absorbing particles in the dispersion liquid stage is preferably adjusted to a suitable dispersed particle size in the LTHC layer for this purpose.

A method of mixing the dispersion liquid and the binder component is also not particularly limited. For example, the same pulverizing/dispersing means as those used in preparing the dispersion liquid may be used to mix the dispersion liquid with the binder component. However, in the case where the ink is prepared as described above, it is sufficient to mix the dispersion liquid and binder component so that they may be fully mixed, and the mixing time can be shortened compared to that in preparing the dispersion liquid.

(II) Ink Application Step

The method of applying the ink on the base material is not particularly limited. For example, application can be performed by a bar coating method, a gravure coating method, a spray coating method, a dip coating method or the like.

The film base material is not particularly limited. An arbitrary film base material may be used depending on the application. For example, the film base material similar to those for the donor sheet described below may also be used.

(III) Ink Drying Step

The method of drying the ink in the ink drying step is not particularly limited. For example, drying can be performed selecting the heating temperature depending on the boiling point of the solvent used, (IV) Ink Curing Step In ink curing step, the method of curing the ink dried in the drying step is not particularly limited. The ink can be cured by a method depending on the resin or the like as the binder component. For example, in the case where the binder component is an ultraviolet curable resin, UV irradiation enables curing. In addition, in the case where the binder component is a thermoset resin, the temperature may be raised to the curing temperature to attain curing.

(V) Manufactured LTHC Layer

According to the steps described above, the LTHC layer according to the present invention can be obtained. The LTHC layer according to the present invention can be used in various applications requiring the LTHC layer which absorbs a laser beam to generate heat. Such applications are not particularly limited. For example, the LTHC layer according to the present invention can be suitably used as a LTHC layer for a donor sheet.

[2] Film Base Material

The film base material 21 is a layer supporting the LTHC layer 22 and the transferred layer 23. Therefore, in order to irradiate the donor sheet 20 with a laser beam, for example, the film base material 21 is irradiated with a laser beam having a wavelength around 1000 nm from the other face 21B side. In this regard, the film base material 21 is preferably excellent in transmission property particularly to the light in the near-infrared region so that such a laser beam can transmit to reach as far as the LTHC layer 22. In addition, the film base material 21 is preferably excellent in transmission property to the visible light as well so that a defect such as a foreign matter or uneven application in the donor sheet 20 can be detected by visual observation or by using a visible light sensor or the like.

In this regard, a material excellent in transmission property of the visible light and the light in near-infrared region is preferably used as a film base material 21. Specifically, for example, one or more materials selected from glass, polyethylene terephthalate (PET), acrylics, urethane, polycarbonate, polyethylene, ethylene vinyl acetate copolymer, vinyl chloride, and fluororesin can be used as the film base material 21.

The thickness of the film base material 21 is not particularly limited and can be optionally selected depending on the type of the material used for the film base material 21, transmission property to the visible light and the near-infrared light required for the donor sheet and the like.

The thickness of the film base material 21 is preferably 1 µm or more and 200 µm or less, and more preferably 2 µm or more and 50 µm or less, for example. The reason is that the thickness of the film base material 21 being 200 µm or less can preferably enhance transmission property to the visible and the near-infrared light. In addition, the thickness of the film base material 21 being 1 µm or more can support the LTHC layer 22 or the like formed on the film base material 21 and can prevent breakage of the donor sheet 20, in particular.

[3] Transferred Layer

The transferred layer 23 is a layer which is peeled off from the donor sheet 20 and transferred by irradiation of the donor sheet 20 with a laser beam and may be an arbitrary layer without particular limitation on its configuration. In addition, FIG. 2 illustrates an example in which the transferred layer 23 is constituted by one layer. The transferred layer 23 is not limited to such an example and may be constituted by two or more layers, for example, As described before, the donor sheet 20 can be used, for example, in order to form an organic electroluminescence device. In this regard, the transferred layer 23 may be constituted so as to include, for example, one or more layers selected from a hole injection layer, a hole transport layer, an organic light emitting layer, an electron transport layer, a blocking layer, an electron transport layer and the like which constitute the organic electroluminescence device.

It should be noted that the method of forming the transferred layer 23 is not particularly limited, and the layer may be formed by an arbitrary method depending on the type of the material constituting the layer.

In addition, the donor sheet 20 can be used not only for forming an organic electroluminescence device but also for forming various electronic devices including an electronic circuit, a resistor, a capacitor, a diode, a rectifier, a memory element, and a transistor, various optical devices including an optical waveguide, and the like. In this regard, the transferred layer 23 may be of arbitrary configuration depending on the application.

An exemplary configuration of the donor sheet has been explained. However, the configuration of the donor sheet is not limited to the embodiment and may have an arbitrary layer added thereto. For example, an intermediate layer may be interposed between the LTHC layer 22 and the transferred layer 23 to provide a configuration such that a damage and contamination in a portion to be transferred on the transferred layer 23 is suppressed.

The configuration of the intermediate layer is not particularly limited. It can be constituted, for example, by a polymer film, a metal layer, an inorganic layer (an inorganic oxide layer such as silica, titania or the like), an organic/inorganic composite layer or the like.

The order of disposing each layer of the donor sheet is not limited to the embodiment illustrated in FIG. 2. For example, the transferred layer 23 may be placed on the one face 21A of the film base material 21, while the LTHC layer 22 may be placed on the other face 21B.

[4] Donor sheet

An exemplary configuration of the donor sheet according to the present invention has been explained. The donor sheet according to the present invention has the above-described LTHC layer according to the present invention. Since the LTHC layer according to the present invention has high transmissivity to the visible light, a defect in the donor sheet can be detected by visual observation or by using a visible light sensor or the like even through the LTHC layer, and a donor sheet having such a defect may be removed by a test. Accordingly, the yield of an electronic device such as an organic electroluminescence device, an optical device or the like fabricated using the donor sheet can be increased. Furthermore, since the LTHC layer according to the present invention has low haze, the LTHC layer of the present invention is a donor sheet which can enhance transfer accuracy of an organic electroluminescence device by irradiation of a laser beam.

EXAMPLES

Hereinafter, specific examples will be provided to explain the present invention in more detail, but the present invention is not limited to these examples. In the following Examples 1 to 19 and Comparative Examples 1 to 5, a LTHC layer and a donor sheet were fabricated and evaluated.

Example 1

Fabrication of LTHC Layer

A LTHC layer was fabricated through the following procedure.

In 0.330 kg of water, 0.216 kg of $Cs_2CO_3$ was dissolved, which was added to 1.000 kg of $H_2WO_4$ and the resultant was stirred thoroughly and dried to obtain a powder mixture of $Cs_{0.33}WO_3$ having a target composition.

Subsequently, a high-frequency plasma reactor was used and an inside of the reaction system was evacuated to about 0.1 Pa (about 0.001 Torr) by a vacuum pumping unit, and then completely replaced with argon gas to obtain a flow system at 1 atm. After that, argon gas was introduced into a reaction vessel as a plasma gas at a flow rate of 30 L/min, and argon gas and helium gas were helically introduced through a sheath gas supply port as sheath gases at a flow rate of 55 L/min and 5 L/min, respectively. Subsequently, high-frequency electricity was applied to a water cooled copper coil for generating a high-frequency plasma to generate a high-frequency plasma. In this case, the high-frequency electricity was set to 40 KW in order to generate thermal plasma having a hot area of 10,000 to 15,000 K.

After the high-frequency plasma was generated under the above-described condition, the above-described powder mixture was supplied into the thermal plasma at a rate of 50 g/min while supplying argon gas as a carrier gas at a flow rate of 9 L/min from a gas supply unit.

As the result, the powder mixture was instantaneously evaporated in the thermal plasma and rapidly cooled and solidified to be atomized on the way to the tail area of the plasma flame. Thus generated fine particles were accumulated on a recovering filter.

The accumulated fine particles were collected and X ray diffraction pattern was measured by a X-ray powder diffraction method (θ-2θ method) using a X-ray powder diffraction apparatus (X'Pert-PRO/MPD manufactured by Mulvern Palytical, Spectris Co., Ltd.).

The obtained fine particles were subjected to a X-ray powder diffraction measurement, and consequently identified as a hexagonal crystalline $Cs_{0.33}WO_3$ single phase. Further, the crystal structure was analyzed by Rietveld analysis method using the obtained X ray diffraction pattern. The crystallite size of the obtained fine particles was 24.7 nm. Furthermore, the peak top intensity in the X ray diffraction pattern of the obtained fine particles was 4,200 counts.

The composition of the obtained fine particles was studied by ICP emission spectrometry. As the result, Cs concentration was 13.6% by mass, W concentration was 65.3% by mass, and Cs/W molar ratio was 0.29. The remnant other than Cs and W was oxygen, and it was confirmed that there was no other impurity element contained at 1% by mass or more.

Subsequently, 20 parts by weight of the obtained composite tungsten oxide fine particles, 64 parts by weight of methyl isobutyl ketone, and 16 parts by weight of an acrylic polymeric dispersant having as a functional group an amine-containing group (an acrylic dispersant having an amine number of 48 mgKOH/g, a decomposition temperature of 250° C. (hereinafter referred to as a "dispersant a") were mixed to prepare 3 kg of a slurry. The slurry was charged along with beads in a media stirring mill and subjected to grinding and dispersion liquid treatment for an hour. Note that a media stirring mill of lateral cylindrical annular type (manufactured by Ashizawa Finetech Ltd.) was used in which an inner wall of a vessel and a rotor (rotating stirrer part) were made of zirconia. In addition, a head having a diameter of 0.1 mm made of YSZ (Yttria-Stabilized Zirconia) was used as the bead. The rotating speed of the rotor was 14 rpm/sec, and the grinding and dispersion liquid treatment was performed at a slurry flow rate of 0.5 kg/min to obtain the composite tungsten oxide fine particle dispersion liquid according to Example 1.

In the in a X ray diffraction pattern of the composite tungsten oxide fine particles contained in the composite tungsten oxide fine particle dispersion liquid according to Example 1, that is, the composite tungsten oxide fine particles after grinding and dispersion liquid treatment, a peak top intensity value was 3,000 counts and a peak position was 2θ=27.8°.

On the other hand, silicon powder standard sample (640c, manufactured by NIST) was prepared, and a peak intensity based on a (220) plane in the silicon powder standard sample was measured to be 19,800 counts. Accordingly, the value of the XRD peak intensity ratio of the composite tungsten oxide fine particles according to Example 1 after the grinding and dispersion liquid treatment to a peak intensity of the standard sample being 1 was found to be 0.15.

In addition, the crystallite size of the composite tungsten oxide fine particles according to Example 1 after grinding and dispersion liquid treatment was 16.9 nm.

Furthermore, using a particle size measurement system based on a dynamic light scattering method (ELS-8000 manufactured by Otsuka Electronics Co., Ltd.), a dispersed particle size of the composite tungsten oxide fine particle dispersion liquid according to Example 1 was measured to be 70 nm. Regarding setting of the particle size measurement, the particle refraction index was 1.81, and the shape of the particle was non-spherical. In addition, background was measured using methyl isobutyl ketone, and a solvent refraction index was 1.40.

Subsequently, an ultraviolet curable resin and methyl isobutyl ketone were mixed into the obtained composite tungsten oxide fine particle dispersion liquid to prepare the ink according to Example 1, which was coated onto a PET film having a thickness of 50 μm using a bar coater (IMC-700 manufactured by Imoto machinery Co., LTD.) to form a coating layer, and the coating layer was dried at 80° C. for 60 seconds to evaporate the solvent. After that, the coating layer was cured by ultraviolet irradiation to prepare a LTHC layer containing composite tungsten oxide fine particles on the film base material.

The dispersed particle size of the composite tungsten oxide fine particles dispersed in the LTHC layer was calculated to be 18 nm by an image processing apparatus using a transmission-type electron microscopic image. In addition, the layer thickness of the LTHC layer was 2.5 μm according to a TEM image.

The optical property of the sheet formed of the LTHC layer was measured using a spectrophotometer (U-4100 manufactured by Hitachi, Ltd.) in a wavelength range from 200 nm to 2600 nm at a 5 nm interval. The film base material used itself was similarly measured for its optical property, which was subtracted from the above-described measurement to calculate the optical property of the LTHC layer. As the result, the solar transmissivity was 35.2%.

In addition, haze was evaluated using Haze Meter (HM-150 manufactured by MURAKAMI COLOR RESEARCH LABORATORY) according to JIS K 7105.

The evaluation results are illustrated in Table 1.

Fabrication of Donor Sheet

A transferred layer was further formed on the fabricated LTHC layer to form a donor sheet. The donor sheet was formed so as to have a structure illustrated in FIG. 2.

Specifically, the transferred layer 23 was formed on the top surface of the LTHC layer 22. As the transferred layer 23, an electron transport layer, an organic light emitting layer, a hole transport layer, and a hole injection layer were sequentially layered from the LTHC layer 22 side.

Each layer included in the transferred layer 23 was formed into a layer in the manner described below.

As the electron transport layer, Alq3 [tris(8-quinolinolato) aluminum (III)] was formed into a layer by a vapor deposition method. The layer thickness was 20 nm.

In addition, as the organic light emitting layer, a material obtained by mixing 2.5% by weight of 4,4'-bis[2-{4-(N,N-diphenylamino)phenyl}vinyl]biphenyl (DPAVBi) which is a blue light-emitting gest material with ADN (anthracene dinaphthyl) which is an electron-transporting host material was formed into a layer by a vapor deposition method. The layer thickness was about 25 nm.

As the hole transport layer, α-NPD [4,4-bis(N-1-naphthyl-N-phenylamino)biphenyl] was formed into a layer by a vapor deposition method, and the layer thickness was 30 nm.

As the hole injection layer, m-MTDATA [4,4,4-tris(3-methylphenylphenylamino)triphenylamine] was formed into a layer by a vapor deposition method, and the layer thickness was 10 nm.

The obtained donor sheet was checked for its condition by visually observing the transferred layer 23 from the film base material side.

Example 2

The composite tungsten oxide fine particles and the composite tungsten oxide fine particle dispersion liquid according to Example 2 were manufactured in the same manner as in Example 1 except that a powder mixture of $Cs_2CO_3$ and $H_2WO_4$ described in Example 1 was changed to a composite tungsten oxide represented by $Cs_{0.33}WO_3$ which had been fired under an atmosphere of a mixed gas of nitrogen gas and hydrogen gas at 800° C., and used as a raw material to be charged in a high-frequency plasma reactor.

The obtained composite tungsten oxide fine particles according to Example 2 was identified as hexagonal crystalline $Cs_{0.33}WO_3$ single phase according to the X-ray powder diffraction measurement result.

The obtained composite tungsten oxide fine particles and a dispersion liquid thereof according to Example 2 were evaluated in the same manner as in Example 1. The evaluation results are illustrated in Table 1.

Example 3

In 0.330 kg of water was dissolved 0.148 kg of $Rb_2CO_3$, which was added to 1.000 kg of $H_2WO_4$, and the resultant was stirred thoroughly and dried to obtain a $Rb_{0.32}WO_3$ powder mixture which had a target composition.

The composite tungsten oxide fine particles and the composite tungsten oxide fine particle dispersion liquid according to Example 3 were manufactured in the same manner as in Example 1, except that the above-described powder mixture was used as the raw material to be charged in the high-frequency thermal plasma reactor.

The obtained composite tungsten oxide fine particles according to Example 3 was identified as hexagonal crystalline $Rb_{0.32}WO_3$ single phase according to the result of the X-ray powder diffraction measurement.

The obtained composite tungsten oxide fine particles and a dispersion liquid thereof, a coating layer and cured layer thereof according to Example 3 were evaluated in the same manner as in Example 1. The evaluation results are illustrated in Table 1.

Example 4

In 0.330 kg of water was dissolved 0375 kg of $K_2CO_3$, which was added to 1,000 kg of $H_2WO_4$, and the resultant was stirred thoroughly and dried to obtain a $K_{0.27}WO_3$ powder mixture which had a target composition.

The composite tungsten oxide fine particles and the composite tungsten oxide fine particle dispersion liquid according to Example 4 were manufactured in the same manner as in Example 1, except that the above-described powder mixture was used as the raw material to be charged in the high-frequency thermal plasma. reactor.

The obtained composite tungsten oxide fine particles according to Example 4 was identified as hexagonal crystalline $K_{0.27}WO_3$ single phase according to the X-ray powder diffraction measurement result.

In addition, the obtained composite tungsten oxide fine particles and a dispersion liquid thereof, a coating layer and cured layer thereof according to Example 4 were evaluated in the same manner as in Example 1. The evaluation results are illustrated in Table 1.

Example 5

In 0.330 kg of water was dissolved 0.320 kg of $TlNO_3$, which was added to 1.000 kg of $H_2WO_4$, and the resultant was stirred thoroughly and dried to obtain a $Tl_{0.19}WO_3$ powder mixture which had a target composition. The composite tungsten oxide fine particles and the composite tungsten oxide fine particle dispersion liquid according to Example 5 were manufactured in the same manner as in Example 1, except that the above-described powder mixture was used as the raw material to be charged in the high-frequency thermal plasma reactor.

The obtained composite tungsten oxide fine particles according to Example 5 was identified as hexagonal crystalline $Tl_{0.19}WO_3$ single phase according to the X-ray powder diffraction measurement result.

The obtained composite tungsten oxide fine particles and a dispersion liquid thereof, a coating layer and cured layer thereof according to Example 5 were evaluated in the same manner as in Example 1. The evaluation results are illustrated in Table 1.

Example 6

In 0.330 kg of water was dissolved 0.111 kg of $BaCO_3$, which was added to 1.000 kg of $H_2WO_4$, and, after thoroughly stirring, dried to obtain $Ba_{0.14}WO_3$ powder mixture which had a target composition.

The composite tungsten oxide fine particles and the composite tungsten oxide fine particle dispersion liquid according to Example 6 were manufactured in the same manner as in Example 1, except that the above-described powder mixture was used as the raw material to be charged in the high-frequency thermal plasma reactor.

The obtained composite tungsten oxide fine particles according to Example 6 was identified as hexagonal crystalline $Ba_{0.14}WO_3$ single phase according to the X-ray powder diffraction measurement result.

The obtained composite tungsten oxide fine particles and a dispersion liquid thereof, a coating layer and cured layer thereof according to Example 6 were evaluated in the same manner as in Example 1. The evaluation results are illustrated in Table 1.

Example 7

In 0.330 kg of water were dissolved 0.0663 kg of $K_2CO_3$ and 0.0978 g of $Cs_2CO_3$, which was added to 1.000 kg of $H_2WO_4$, and the resultant was stirred thoroughly, then dried to obtain a $K_{0.24}Cs_{0.15}WO_3$ powder mixture which has a target composition.

The composite tungsten oxide fine particles and the composite tungsten oxide fine particle dispersion liquid according to Example 7 were manufactured in the same manner as in Example 1, except that the above-described powder mixture was used as the raw material to be charged in the high-frequency thermal plasma reactor.

The obtained composite tungsten oxide fine particles according to Example 7 was identified as hexagonal crystalline $K_{0.24}Cs_{0.15}WO_3$ phase according to the X-ray powder diffraction measurement.

The obtained composite tungsten oxide fine particles and a dispersion liquid thereof, a coating layer and cured layer thereof according to Example 7 were evaluated in the same manner as in Example 1. The evaluation results are illustrated in Table 1.

Example 8

In 16.5 g of water was dissolved 10.8 g of $Cs_2CO_3$, the resulting solution was added to 50 g of $H_2WO_4$, and the resultant was stirred thoroughly and then dried. The dried matter was heated while supplying 2% $H_2$ gas along with $N_2$ gas as a carrier thereto and fired at the temperature of 800° C. for 30 minutes. After that, a solid phase method involving firing under $N_2$ gas atmosphere at 800° C. for 90 minutes provided the composite tungsten oxide fine particles according to Example 8.

In the same manner as in Example 1 except the operation described above, the composite tungsten oxide fine particle dispersion liquid according to Example 8 was manufactured. In this case, the grinding/dispersion liquid treatment time by the media stirring mill was 4 hours.

The obtained composite tungsten oxide fine particles according to Example 8 was identified as hexagonal crystalline $Cs_{0.33}WO_3$ single phase according to the X-ray powder diffraction measurement result.

The obtained composite tungsten oxide fine particles and a dispersion liquid thereof, a coating layer and cured layer thereof according to Example 8 were evaluated in the same manner as in Example 1. The evaluation results are illustrated in Table 1.

Example 9

In 0.330 kg of water was dissolved 0.216 kg of $Cs_2CO_3$, the resulting solution was added to 1.000 kg of $H_2WO_4$, and the resultant was stirred thoroughly and then dried to obtain a dried matter. The dried matter was heated while supplying 5% $H_2$ gas along with $N_2$ gas as a carrier thereto and fired at the temperature of 800° C. for an hour. After that, a solid phase method involving firing under $N_2$ gas atmosphere at 800° C. for 2 hours was performed to provide the composite tungsten oxide.

Twenty parts by weight of the obtained composite tungsten oxide and 80 parts by weight of water were mixed to prepare about 3 kg of a slurry. Note that this slurry included no dispersant added thereto. This slurry was charged along with beads in a media stirring mill and subjected to grinding and dispersion liquid treatment for 4 hours. Note that a media stirring mill of lateral cylindrical annular type (manufactured by Ashizawa Finetech Ltd.) was used in which an inner wall of a vessel and a rotor (rotating stirrer part) were made of zirconia. In addition, a bead having a diameter of 0.1 mm made of YSZ (Yttria-Stabilized Zirconia) was used as the bead. The rotating speed of the rotor was 14 rpm/sec, and the grinding and dispersion liquid treatment was performed at a slurry flow rate of 0.5 kg/min to obtain an aqueous dispersion liquid of the composite tungsten oxide fine particles.

A dispersed particle size of the aqueous dispersion liquid of the composite tungsten oxide fine particles according to Example 9 was measured to be 70 nm. Regarding setting of the particle size measurement of the dispersed particles, the particle refraction index was 1.81 and the shape of the particles was non-spherical. In addition, background was measured using water, and a solvent refraction index was 1.33.

Subsequently, about 3 kg of the obtained aqueous dispersion liquid of the composite tungsten oxide fine particles was subjected to drying processing using an air dryer to obtain the composite tungsten oxide fine particles according to Example 9. In this regard, as the air dryer, a constant temperature oven model SPH-201 (manufactured by ESPEC CORP.) was used, and the drying temperature was 70° C. and the drying time was 96 hours.

As a result of the X-ray powder diffraction pattern measurement and the phase identification of the composite tungsten oxide fine particles according to Example 9, the obtained fine particles were identified as hexagonal crystalline $Cs_{0.33}WO_3$ single phase. Furthermore, the peak top intensity in the X ray diffraction pattern of the obtained fine particles was 4200 counts, the peak position was $2\theta=27.8°$, and the crystallite size was 23.7 nm. On the other hand, silicon powder standard sample (640c, manufactured by NIST) was prepared, and a peak intensity based on a (220) plane in the silicon powder standard sample was measured to be 19,800 counts. Accordingly, the value of the XRD peak intensity ratio of the composite tungsten oxide fine particles according to Example 1 after the grinding and dispersion liquid treatment relative to a peak intensity of the standard sample being 1 was found to be 0.21.

The composition of the obtained fine particles was studied by ICP emission spectrometry. As the result, Cs concentration was 15.2% by mass, W concentration was 64.6% by mass, and Cs/W molar ratio was 0.33. The remnant other than Cs and W was oxygen, and it was confirmed that there was no other impurity element contained at 1% by mass or more.

Furthermore, 20 parts by weight of the obtained composite tungsten oxide fine particles was dispersed in 64 parts by weight of methyl isobutyl ketone as a solvent and 16 parts by weight of a dispersant a to obtain 50 g of the composite tungsten oxide fine particle dispersion liquid according to Example 9.

A dispersed particle size of the composite tungsten oxide fine particle dispersion liquid according to Example 9 was measured to be 80 nm. Regarding setting of the particle size measurement, the particle refraction index was 1.81, and the shape of the particles was non-spherical. In addition, background was measured using methyl isobutyl ketone, and a solvent refraction index was 1.40.

The dispersed particle size of the obtained composite tungsten oxide fine particles dispersed in the cured layer according to Example 9 was calculated to be 23 nm by an image processing apparatus using a transmission-type electron microscopic image, which was almost equal to the above-described crystallite size of 23.7 nm.

In addition, the transmissivity of the resulting cured layer according to Example 9 was measured in a wavelength range from 200 nm to 2600 nm at intervals of 5 nm. As the result, the solar transmissivity was 38.3%.

The evaluation results according to Example 9 are illustrated in Table 1.

Example 10

The composite tungsten oxide fine particles and the composite tungsten oxide fine particle dispersion liquid according to Example 10 were manufactured in the same manner as in Example 9, except that drying processing by the air dryer was changed to vacuum drying processing by a vacuum stirring grinding mixer. As the vacuum stirring grinding mixer, Ishikawa-type stirring grinding mixer model 24P (manufactured by TAJIMA-KK.) was used, and the drying temperature was 80° C., the drying time was 32 hours, the rotational frequency of the kneading mixer was 40 Hz, and the pressure in the vacuum vessel was 0.001 MPa or less in the vacuum drying processing.

The obtained composite tungsten oxide fine particles and a dispersion liquid thereof, a coating layer and cured layer thereof according to Example 10 were evaluated in the same manner as in Example 1. The evaluation results are illustrated in Table 1.

Example 11

The composite tungsten oxide fine particles and the composite tungsten oxide fine particle dispersion liquid according to Example 11 were manufactured in the same manner as in Example 9, except that drying processing by an air dryer was changed to drying processing by a spray dryer. As the spray dryer, a spray dryer type ODL-20 (manufactured by OHKAWARA KAKOHKI CO., LTD) was used.

The resulting composite tungsten oxide fine particles and a dispersion liquid thereof according to Example 11, the coating layer thereof, the cured layer thereof, and the cured layer thereof were evaluated in the same manner as in Example 1. The evaluation results are illustrated in Table 1.

Examples 12 to 14

The composite tungsten oxide fine particles and the composite tungsten oxide fine particle dispersion liquid according to Examples 12 to 14 were manufactured in the same manner as in Example 9, except that the grinding and dispersion liquid treatment time by a media stirring mill was changed to 2 hours. In this case, the grinding and dispersion liquid treatment time by the media stirring mill was 2 hours.

The resulting composite tungsten oxide fine particles and a dispersion liquid thereof according to Examples 12 to 14, the coating layer thereof and the cured layer thereof were evaluated in the same manner as in Example 1. The manufacturing conditions and evaluation results are illustrated in Table 1.

Examples 15 to 17

The composite tungsten oxide fine particles and the composite tungsten oxide fine particle dispersion liquid according to Examples 15 to 17 were manufactured in the similar method in Example 12, except that 20 parts by weight of the composite tungsten oxide and 80 parts by weight of propylene glycol monoethyl ether were mixed for preparation of a slurry.

The resulting composite tungsten oxide fine particles and a dispersion liquid thereof according to Examples 15 to 17, the coating layer thereof and the cured layer thereof were evaluated in the same manner as in Example 1, it should be noted that the background was measured with propylene glycol monoethyl ether, and the solvent refraction index was set to 1.40, when the dispersed particle size was to be measured. The evaluation results are illustrated in Table 1.

Example 18

The composite tungsten oxide fine particles were obtained in the same manner as in method according to Example 1. After that, 20 parts by weight of the obtained fine particles, 64 parts by weight of methyl isobutyl ketone, and 16 parts by weight of dispersant a were mixed to prepare 50 g of a slurry. Dispersion liquid processing was performed to the slurry for 1 hour using an ultrasonic homogenizer (US-600TCVP manufactured by NIHONSEIKI KAISHA LTD.) to obtain a composite tungsten oxide fine particle dispersion liquid according to Example 18.

The resulting composite tungsten oxide fine particle dispersion liquid according to Example 18, the coating layer thereof and the cured layer thereof were evaluated in the same manner as in Example 1. The evaluation results are illustrated in Table 1.

Example 19

The LTHC layer was formed to fabricate the donor sheet according to Example 19 in the same manner as in Example 1, except that the specification of the bar coater was changed in order to change the layer thickness of the coating layer when the LTHC layer was formed on the PET film. The layer thickness of the LTHC layer (cured layer) was 3.0 μm from the TEM image.

The resulting coating layer thereof and cured layer thereof according to Example 19 were evaluated in the same manner as in Example 1. The evaluation results are illustrated in Table 1.

Comparative Examples 1 to 2

In a same manner as in Example 1, except that a carrier gas flow rate and a raw material supplying rate were changed to 3 L/min and 15 g/min, respectively, in Comparative Example 1 and a plasma gas flow rate was changed to 15 L/min in Comparative Example 2, the composite tungsten oxide fine particles and composite tungsten oxide fine particle dispersion liquids according to Example 1 and 2 were obtained.

The obtained composite tungsten oxide fine particles according to Comparative Example 1 and Comparative Example 2 were identified as hexagonal crystalline $Cs_{0.33}WO_3$ phase according to the result of the X-ray powder diffraction measurement.

The obtained composite tungsten oxide fine particles and dispersion liquids thereof according to Comparative Examples 1 and 2, the coating layer thereof and the cured layer thereof were evaluated in the same manner as in Example 1. The evaluation results are illustrated in Table 1.

Subsequently, a compounding ratio of the composite tungsten oxide fine particle dispersion liquid according to Comparative Example 1, the ultraviolet curable resin used in Example 1, and methyl isobutyl ketone was adjusted to form a LTHC layer having a layer thickness of 2.5 μm and transmissivity to the light having a wavelength of 1000 nm of 5%.

The LTHC layer according to Comparative Example 1 having transmissivity to the light having the wavelength 1000 nm of 5% and a layer thickness of 2.5 μm was measured for optical properties in the same manner as in Example 1, the resultant had visible light transmissivity of 25%, solar transmissivity of 13%, and haze of 5%, and was found not to be transparent upon visual observation.

Comparative Example 3

The composite tungsten oxide fine particles and the composite tungsten oxide fine particle dispersion liquid according to Comparative Example 3 were obtained in the same manner as in Example 1, except that high-frequency electricity was set to 1.5 KW in order to generate thermal plasma having a hot area of 5000 to 10000 K.

The obtained composite tungsten oxide fine particles according to Comparative Example 3 was identified as hexagonal crystalline $Cs_{0.33}WO_3$ phase according to the result of the X-ray powder diffraction measurement.

The obtained composite tungsten oxide fine particles and dispersion liquids thereof according to Comparative Example 3, the coating layer thereof and the cured layer thereof were evaluated in the same manner as in Example 1. The manufacturing conditions and evaluation results are illustrated in Table 1.

Comparative Example 4

The aqueous dispersion liquid of the composite tungsten oxide fine particles according to Comparative Example 4 was obtained in the same manner as in Example 9 except that the composite tungsten oxide fine particle aqueous dispersion liquid according to Example 9 was obtained by grinding and dispersion liquid treatment for 40 hours rather than by grinding and dispersion liquid treatment for 4 hours.

The obtained composite tungsten oxide fine particles and a dispersion liquid thereof, the coating layer thereof and the cured layer thereof according to Comparative Example 4 were evaluated in the same manner as in Example 1. The evaluation results are illustrated in Table 1.

Comparative Example 5

The composite tungsten oxide fine particles as the infrared absorbing particles were replaced with carbon black to fabricate the LTHC layer and the donor sheet.

Carbon black (BET specific surface area 300 $m^2/g$), a dispersant, and a solvent were pulverized/dispersed to prepare a dispersion liquid. A dispersion liquid contains 10% by mass of carbon black.

Regarding a dispersant, the same dispersant a as that in Example 1 was used and weighed so that the percentage in the dispersion liquid was 5% by weight.

Regarding a solvent, methyl isobutyl ketone was used and weighed so that the percentage in the dispersion liquid was 85% by weight.

The near-infrared absorbing particles, the dispersant, and the solvent were charged in a paint shaker containing 0.3 mmφ $ZrO_2$ beads, and subjected pulverizing/dispersing treatment for 4 hours to obtain a carbon black particle dispersion liquid (hereinafter abbreviated as dispersion liquid B).

In this case, the dispersed particle size of the carbon black particles in the dispersion liquid according to Comparative Example 5 was measured in the same manner as in Example 1. As a result, it was found to be 17 nm.

Subsequently, the obtained dispersion liquid according to Comparative Example 5 was mixed with a hinder component to prepare an ink. In this comparative example, as a hinder component, UV-3701 was used which was same as that used in Example 1.

One hundred parts by weight of UV-3701 was mixed with 100 parts by weight of the dispersion liquid according to Comparative Example 5 to form the ink according to Comparative Example 5 containing a carbon black particles.

It should be noted that the dispersed particle size of the carbon black particles after formulated into an ink was also measured in the same manner as in Example 1, and it was found to be 17 nm.

Next, the obtained ink (coating liquid) was coated onto a 50 μm-thick PET film of using a bar coater to form a coating layer. Then, drying and ultraviolet irradiation for curing in the same manner as in Example 1 provided a LTHC layer.

In the same manner as in Example 1, TEM observation was performed on a cross section of the film base material. As a result, the thickness of the LTHC layer was found to be 2.5 μm.

In the same manner as in Example 1, the transmissivity of the LTHC layer to the visible light and transmissivity of the LTHC layer to the light having wavelength of 1000 nm were calculated to be 2% and 13%, respectively, and haze was found to be 98.2%.

In addition, a transferred layer is further formed on the fabricated LTHC layer in the same manner as in Example 1, and thus a donor sheet was formed.

TABLE 1

| | Crystal system | Hetero-geneous phase | Peak top intensity Raw material powder (Count) | Peak top intensity After dispersion (Count) | Peak intensity of (220) plane of standard sample | Peak top intensity ratio | 2θ at peak position [°] | x/y | Crystallite size [nm] | Dispersed particle size [nm] | Particle size in cured layer [nm] | Optical properties a [%] | b [%] | c [%] | Haze [%] |
|---|---|---|---|---|---|---|---|---|---|---|---|---|---|---|---|
| Example 1 | Hexagonal crystal | None | 4200 | 3000 | 19800 | 0.15 | 27.8 | 0.29 | 24.7 | 70 | 18 | 59.8 | 35.2 | 3 | 1.0 |
| Example 2 | | | 5200 | 4000 | 19800 | 0.20 | 27.8 | 0.29 | 23.0 | 80 | 22 | 70.0 | 35.1 | 3 | 1.0 |
| Example 3 | | | 4000 | 3000 | 19800 | 0.15 | 27.8 | 0.32 | 17.2 | 70 | 22 | 70.3 | 35.8 | 8 | 1.0 |
| Example 4 | | | 3000 | 2900 | 19800 | 0.15 | 27.8 | 0.27 | 17.5 | 70 | 17 | 70.2 | 41.2 | 13 | 1.0 |
| Example 5 | | | 4000 | 2000 | 19800 | 0.15 | 27.8 | 0.19 | 18.5 | 80 | 18 | 70.3 | 40.5 | 18 | 1.0 |
| Example 6 | | | 4200 | 3100 | 19800 | 0.16 | 28.1 | 0.14 | 17.3 | 70 | 17 | 88.8 | 40.7 | 13 | 1.0 |
| Example 7 | | | 4000 | 3200 | 19800 | 0.16 | 28.0 | 0.38 | 18.0 | 80 | 18 | 70.1 | 38.5 | 13 | 1.0 |
| Example 8 | | | 2200 | 4200 | 19800 | 0.21 | 27.6 | 0.23 | 23.8 | 80 | 29 | 70.2 | 34.4 | 4 | 1.0 |
| Example 9 | | | 4200 | 4200 | 19800 | 0.21 | 27.8 | 0.32 | 23.7 | 80 | 23 | 69.9 | 38.3 | 4 | 0.9 |
| Example 10 | | | 4200 | 4200 | 19800 | 0.21 | 27.8 | 0.32 | 24.1 | 80 | 24 | 69.8 | 38.0 | 4 | 0.9 |
| Example 11 | | | 4100 | 4100 | 19800 | 0.21 | 27.8 | 0.33 | 23.9 | 80 | 23 | 70.0 | 38.3 | 4 | 0.9 |
| Example 12 | | | 4200 | 5200 | 19800 | 0.31 | 27.8 | 0.33 | 38.2 | 80 | 36 | 70.0 | 38.6 | 6 | 0.9 |
| Example 13 | | | 5900 | 5900 | 19800 | 0.20 | 27.8 | 0.33 | 37.8 | 80 | 32 | 70.0 | 38.4 | 5 | 0.9 |
| Example 14 | | | 5020 | 8000 | 19800 | 0.30 | 27.8 | 0.33 | 28.5 | 80 | 36 | 70.0 | 38.6 | 5 | 0.9 |
| Example 15 | | | 5300 | 5500 | 19800 | 0.28 | 27.8 | 0.33 | 38.7 | 80 | 36 | 69.9 | 38.3 | 5 | 0.9 |
| Example 16 | | | 5400 | 5400 | 19800 | 0.27 | 27.8 | 0.33 | 38.3 | 80 | 32 | 70.1 | 38.6 | 8 | 0.9 |
| Example 17 | | | 5300 | 5300 | 19800 | 0.27 | 27.8 | 0.33 | 38.0 | 80 | 36 | 70.0 | 38.4 | 8 | 0.9 |
| Example 18 | | | 4200 | 4200 | 19800 | 0.21 | 27.8 | 0.33 | 16.9 | 80 | 18 | 70.0 | 38.8 | 5 | 1.2 |
| Example 19 | | | 4200 | 3000 | 19800 | 0.15 | 23.8 | 0.25 | 24.7 | 70 | 18 | 60.1 | 37.0 | 1 | 1.0 |
| Com. Ex. 1 | Hexagonal crystal | None | 1000 | 1000 | 19800 | 0.06 | 27.8 | 0.28 | 3.0 | 70 | 20 | 70.1 | 52.8 | 52 | 1.1 |
| Com. Ex. 2 | | | 1100 | 1100 | 19800 | 0.06 | 27.8 | 0.29 | 8.2 | 80 | 23 | 70.3 | 52.3 | 51 | 1.0 |
| Com. Ex. 3 | | | 3200 | 2400 | 19800 | 0.12 | 27.8 | 0.29 | 32.9 | 80 | 23 | 70.1 | 44.0 | 49 | 1.0 |
| Com. Ex. 4 | | | 1300 | 1200 | 19800 | 0.07 | 27.8 | 0.23 | 3.1 | 120 | 120 | 68.8 | 48.7 | 49 | 2.5 |
| Com. Ex. 5 | — | | — | — | — | — | — | — | — | 17 | — | 2.0 | 9.0 | 13 | 98.2 |

Com. Ex = Comparative Example
a = Visible light transmissivity
b = Solar transmissivity
c = Transmissivity at 1000 nm

CONCLUSION

As is clear from Table 1, the composite tungsten oxide fine particles according to Examples 1 to 19 exhibited excellent near-infrared shielding property of 45% or less solar transmissivity, compared to the composite tungsten oxide fine particles according to Comparative Examples 1 to 4.

In addition, the composite tungsten oxide fine particles contained in the dispersion liquid according to Examples 1 to 19 were composite tungsten oxide fine particles without heterogeneous phase, and having the XRD peak top intensity ratio of the composite tungsten oxide fine particles of 0.13 or more, relative to the XRD peak intensity of the (220) plane of the silicon powder standard sample (manufactured by NIST, 640c) and a crystallite size equal to or more than the requirement. Furthermore, in Examples, since a dispersed particle size and a crystallite size of the composite tungsten oxide fine particles in a cured layer are almost the same value, these composite tungsten oxide fine particles are considered to be single-crystalline composite tungsten oxide fine particles.

On the other hand, in Comparative Examples 1 to 4, peak top intensity ratio was less than 0.13, and a solar transmissivity was 48% or more. In Comparative Example 5, haze was 98.2%.

The donor sheet manufactured in each of Examples was able to be visually confirmed for the condition of the transferred layer from the film base material side, whereas the donor sheet manufactured in each of Comparative Example had the LTHC layer with insufficient transparency and was not be able to be visually confirmed for the condition of the transferred layer.

DESCRIPTIONS OF SIGNS AND NUMERALS

11 Octahedron formed of $WO_6$ unit
12 Element M
20 Donor sheet
21 Film base material
22 LTHC layer
23 Transferred layer

The invention claimed is:

1. A light to heat conversion layer on a base material, the light to heat conversion layer containing:
   near-infrared absorbing particles and
   a binder component;
   wherein:
   the near-infrared absorbing particles are composite tungsten oxide fine particles having a value of a XRD peak top intensity ratio of 0.13 or more, when a XRD peak intensity ratio of a (220) plane of a silicon powder standard sample 640c, as manufactured by NIST, is 1, and
   the composite tungsten oxide fine particles are represented by chemical formula: $M_yWO_z$ in which the M is one or more kinds of elements selected from the group consisting of Cs, Rb, K, Tl, and Ba, and the y and the z satisfy $0.1 \leq y \leq 0.5$ and $2.2 \leq z \leq 3.0$.

2. The light to heat conversion layer on the base material according to claim 1,
wherein the composite tungsten oxide fine particles have a hexagonal crystal structure.

3. The light to heat conversion layer on the base material according to claim 1,
wherein a crystallite size of the composite tungsten oxide fine particles is 200 nm or less.

4. The light to heat conversion layer on the base material according to claim 1,
wherein a thickness of the light to heat conversion layer is 5 µm or less.

5. The light to heat conversion layer on the base material according to claim 1,
which is a dried and cured ink containing the near-infrared absorbing particles, a dispersant, a solvent, and the binder component, coated on a the base material.

6. A donor sheet having the light to heat conversion layer on the base material according to claim 1, comprising a film base material, and a transferrable layer.

7. A method for manufacturing a light to heat conversion layer on a base material, the method comprising:
coating the base material with near-infrared absorbing particles and a binder component to form the light to heat conversion layer,
wherein:
the near-infrared absorbing fine particles are composite tungsten oxide fine particles represented by chemical formula: $M_yWO_z$ in which the M is one or more kinds of elements selected from the group consisting of Cs, Rb, K, Tl, and Ba, and the y and the z satisfy $0.1 \leq y \leq 0.5$ and $2.2 \leq z \leq 3.0$,
the composite tungsten oxide fine particles are produced so that a value of its XRD peak top intensity ratio is 0.13 or more, when the XRD peak intensity value of a (220) plane of a silicon powder standard sample 640c, manufactured by NIST, is 1, and
the obtained composite tungsten oxide fine particles are added into the binder component while maintaining the value of the XRD peak top intensity ratio at 0.13 or more.

* * * * *